(12) United States Patent
Saitou (10) Patent No.: US 10,897,051 B2
(45) Date of Patent: Jan. 19, 2021

(54) CELL CONTROL SYSTEM

(71) Applicant: FANUC CORPORATION, Yamanashi (JP)

(72) Inventor: Manabu Saitou, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 146 days.

(21) Appl. No.: 15/681,429

(22) Filed: Aug. 21, 2017

(65) Prior Publication Data

US 2018/0053951 A1 Feb. 22, 2018

(30) Foreign Application Priority Data

Aug. 22, 2016 (JP) ................................ 2016-162202

(51) Int. Cl.
*H01M 8/04082* (2016.01)
*H01M 8/043* (2016.01)
(Continued)

(52) U.S. Cl.
CPC .... *H01M 8/04082* (2013.01); *G03F 7/70533* (2013.01); *G05B 19/0426* (2013.01);
(Continued)

(58) Field of Classification Search
CPC ............ B60L 11/1881; G03F 7/70533; G05B 19/0426; G05B 19/40937; G05B 19/4184;
(Continued)

(56) References Cited

U.S. PATENT DOCUMENTS

| 5,093,794 A | 3/1992 | Howie et al. |
| 5,216,612 A * | 6/1993 | Cornett ............. G05B 19/4184 700/96 |
| 2005/0102723 A1* | 5/2005 | Van Den Nieuwelaar ................. G03F 7/70525 718/1 |

(Continued)

FOREIGN PATENT DOCUMENTS

| JP | H05113977 A | 5/1993 |
| JP | H8-1485 A | 1/1996 |

(Continued)

OTHER PUBLICATIONS

Office Action in JP Application No. 2016-162202, dated Sep. 4, 2018, 4 pp.

*Primary Examiner* — Chad G Erdman
(74) *Attorney, Agent, or Firm* — Hauptman Ham, LLP (57) ABSTRACT

A cell control system that reduces an abnormality occurrence probability in a manufacturing cell according to a manufacturing cell operation plan includes a cell controller that transmits an operation instruction to a manufacturing machine of the manufacturing cell. The cell controller includes a machine operation instructing unit that transmits the operation instruction to each manufacturing machine based on an operation schedule, an operation information collecting unit that collects operation information of the manufacturing machine, an alarm probability estimating unit that estimates an alarm occurrence probability of the manufacturing machine, a schedule candidate creating unit that creates at least one operation schedule candidate having a changed order of an operation element of the operation schedule or start time, and an optimal candidate selecting unit that selects a shortest necessary time that takes the alarm occurrence into account from the operation schedule and the operation schedule candidate as a selected operation schedule.

2 Claims, 5 Drawing Sheets

(51) Int. Cl.
*G03F 7/20* (2006.01)
*G05B 19/042* (2006.01)
*G05B 19/4093* (2006.01)
*G05B 19/418* (2006.01)

(52) U.S. Cl.
CPC . *G05B 19/40937* (2013.01); *G05B 19/41865* (2013.01); *H01M 8/043* (2016.02); *G05B 19/4184* (2013.01); *G05B 2219/31347* (2013.01); *G05B 2219/32371* (2013.01); *Y02P 90/14* (2015.11); *Y02P 90/20* (2015.11); *Y02P 90/26* (2015.11)

(58) Field of Classification Search
CPC .... G05B 19/41865; G05B 2219/31347; G05B 2219/32371; H01M 8/04082; H01M 8/043; Y02P 90/14; Y02P 90/20; Y02P 90/26
See application file for complete search history.

(56) References Cited

U.S. PATENT DOCUMENTS

| | | | |
|---|---|---|---|
| 2010/0011255 A1* | 1/2010 | de Kleer | G06Q 10/04 714/47.1 |
| 2016/0076970 A1* | 3/2016 | Takahashi | G01M 13/045 702/33 |
| 2018/0203440 A1* | 7/2018 | Lee | G05B 23/0224 |

FOREIGN PATENT DOCUMENTS

| | | |
|---|---|---|
| JP | 11-221740 A | 8/1999 |
| JP | 2003-31454 A | 1/2003 |
| JP | 2004139472 A | 5/2004 |
| JP | 2006-227978 A | 8/2006 |
| JP | 2007-133888 A | 5/2007 |
| JP | 2011-3126 A | 1/2011 |
| JP | 2013114576 A | 6/2013 |
| JP | 2013-186866 A | 9/2013 |

* cited by examiner

OPERATION SCHEDULE

ESTIMATE ALARM STOP TIME OF ENTIRE OPERATION INSTRUCTION OF OPERATION SCHEDULE (0.024 UNIT TIME)

OPERATION SCHEDULE CANDIDATE

ESTIMATE ALARM STOP TIME OF ENTIRE OPERATION INSTRUCTION OF OPERATION SCHEDULE CANDIDATE (0.012 UNIT TIME)

FIG. 5

CELL CONTROL SYSTEM

RELATED APPLICATIONS

The present application claims priority to Japanese patent application No. 2016-162202 filed on Aug. 22, 2016, the disclosure of which is hereby incorporated by reference herein in its entirety.

BACKGROUND OF THE INVENTION

1. Field of the Invention

The present invention relates to a cell control system. More particularly, the present invention relates to a cell control system which makes an operation plan which takes into account a stop time of a machine.

2. Description of the Related Art

Figure 5:
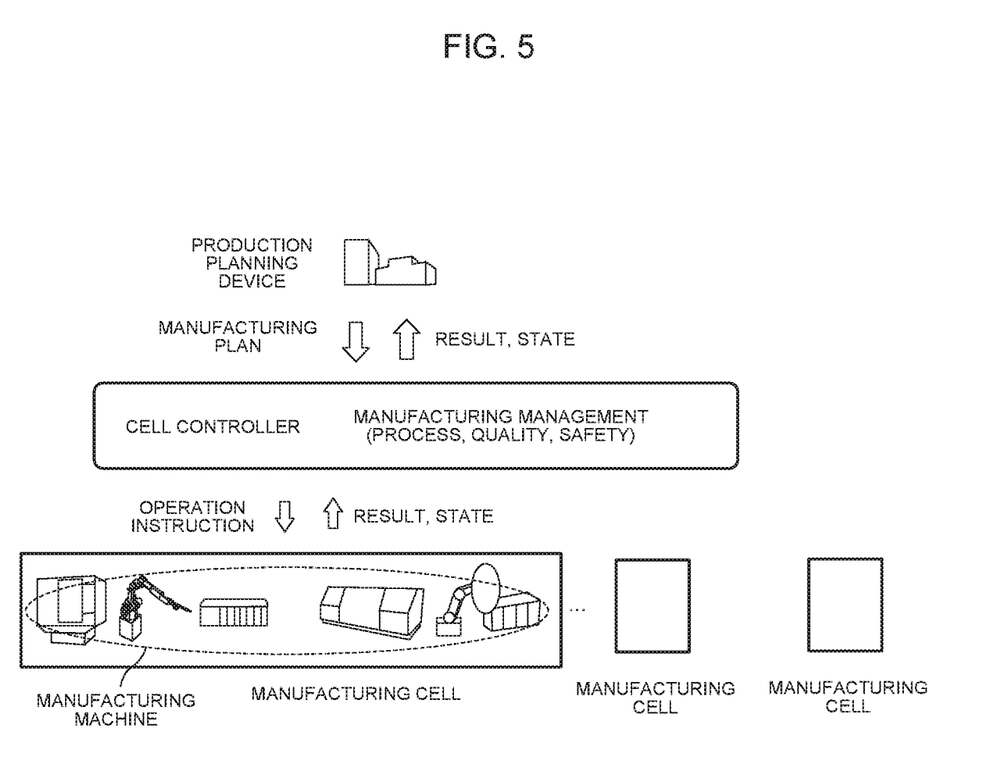
FIG. 5 is a view illustrating a cell control system (manufacturing management system) which manages manufacturing cells configured by a plurality of manufacturing machines.

FIG. 5 is a view illustrating a cell control system (manufacturing management system) which manages manufacturing cells configured by a plurality of manufacturing machines. The cell control system improves an operation rate of the entire manufacturing cells by making an operation instruction to each manufacturing cell based on a manufacturing plan instructed by a production planning device while managing use statuses of the manufacturing machines, and deciding which manufacturing device to use.

When a manufacturing machine of an operating manufacturing cell sets off an alarm and stops operating while the manufacturing cell is operated according to the manufacturing plan, productivity of the manufacturing cell lowers, and the operation rate of the entire manufacturing cells lowers as a result.

As a conventional technique which deals with such a situation, Japanese Patent Applications Laid-Open No. 2013-186866 discloses a processing process planning device which provides to users a processing process plan and a production plan which maximize a productivity index such as an operation rate of processing machines of a machine shop. A processing process planning device disclosed in Japanese Patent Applications Laid-Open No. 11-221740 selects a processing process which maximizes a productivity index such as an operation rate and creates a production plan based on this processing process. A plan maker confirms a created result, reselects the processing process by an input unit if correction is necessary, and recalculates the production plan.

Further, Japanese Patent Applications Laid-Open No. 11-221740 discloses a rescheduling device which can automatically determine and reschedules whether or not to change a schedule (rescheduling) when an abnormality occurs in a production facility. A scheduling device disclosed in Japanese Patent Applications Laid-Open No. 2013-186866 includes a reschedule processing unit which, when detecting an abnormality occurring facility detected by an abnormality detecting unit, a stop time caused by this abnormality, abnormality history data in which an abnormality cause is stored and an abnormality in a facility, searches for the abnormality history data, decides whether or not the same cause is found in a production facility, compares the stop time caused by this abnormality and a reference time when the cause is the same, and changes schedule data when the facility stops for the reference time or more.

Generally, an operation planning device according to the conventional technique performs scheduling which maximizes a production amount based on a necessary time of each machine, allocates processing to machines to maximize the entire throughput, and makes the operation instruction based on this result to improve an operation rate and productivity. However, in many cases, as disclosed in Japanese Patent Applications Laid-Open No. 2013-186866, scheduling which assumes that an abnormality occurs in a machine is not performed. Further, a system disclosed in Japanese Patent Applications Laid-Open 11-221740 proposes a production plan assuming that a machine abnormality occurs yet does not take into account suppression of the abnormality occurrence.

SUMMARY OF THE INVENTION

It is therefore an object of the present invention to provide a cell control system which reduces an abnormality occurrence probability in a manufacturing cell by a manufacturing cell operation plan.

According to the present invention, a control device of a machine included in a manufacturing cell is connected to a cell controller. Each cell controller detects a factor an alarm occurrence due to a following combination.

1. An operation state of a machine itself is a factor (such as deterioration)
2. A combination of a machine and a machine operation state is a factor (such as noise)
3. A combination of a machine and a processing program is a factor (such as characteristics during processing of the machine)

Further, the cell controller creates as a candidate an operation schedule of a manufacturing cell which further avoids an alarm estimation factor within a preset allowable range of a decrease in productivity. For the operation schedule candidate of the manufacturing cell created in this way, and an operation schedule of a manufacturing cell created by a conventional technique, an average necessary time to which an estimated stop time caused by the alarm occurrence is added is calculated. If there is an operation schedule candidate whose average necessary time shortens compared to the operation schedule created by the conventional technique, this operation schedule candidate is selected, and an operation instruction is transmitted to each manufacturing cell according to the selected operation schedule.

Further, a cell control system according to the present invention includes: a production planning device; at least one manufacturing cell that includes at least one manufacturing machine; a cell controller that transmits an operation instruction to the manufacturing machine based on a manufacturing plan received from the production planning device, the cell controller includes a machine operation instructing unit that creates an operation schedule of the manufacturing machine based on the manufacturing plan, and transmits the operation instruction to the manufacturing machine based on the operation schedule, an operation information collecting unit that collects operation information of the manufacturing machine, an alarm probability estimating unit that estimates an alarm occurrence probability based on the operation information collected by the operation information collecting unit, wherein the alarm occurrence probability is a probability that an alarm occurs in the manufacturing machine, a schedule candidate creating unit that creates at least one operation schedule candidate based on the operation schedule created by the machine operation instructing unit, wherein the operation schedule has a changed order of an operation element configuring the operation schedule or a changed start time of the operation time, and an optimal candidate selecting unit that estimates a necessary time that takes the occurrence of the alarm into account for each of the operation schedule and the operation schedule candidate based on the alarm occurrence probability estimated by the alarm probability estimating unit, and selects a shortest necessary time that takes the occurrence of the alarm into account as a selected operation schedule from the operation schedule and the operation schedule candidate, and the machine operation instructing unit transmits the operation instruction to the manufacturing machine based on the selected operation schedule.

In the cell control system according to the present invention, the alarm probability estimating unit estimates a necessary recovery time based on the operation information of the manufacturing machine, wherein the necessary recovery time is a necessary time that is necessary to recover from the alarm when the alarm occurs, and the optimal candidate selecting unit estimates the necessary time that takes the occurrence of the alarm into account for each of the operation schedule and the operation schedule candidate based on the alarm occurrence probability and the necessary recovery time estimated by the alarm probability estimating unit.

According to the present invention, by creating and executing a manufacturing plan which hardly lowers an operation rate when executing a production instruction to a manufacturing cell, it is possible to improve productivity of entire manufacturing cells.

BRIEF DESCRIPTION OF THE DRAWINGS

Aforementioned and other objects and characteristics of the present invention will be made more apparent from description of the following embodiment in view of the accompanying drawings. Of these drawings.

DETAILED DESCRIPTION OF THE PREFERRED EMBODIMENTS

An embodiment of the present invention will be described below with reference to the drawings.

Figure 1:
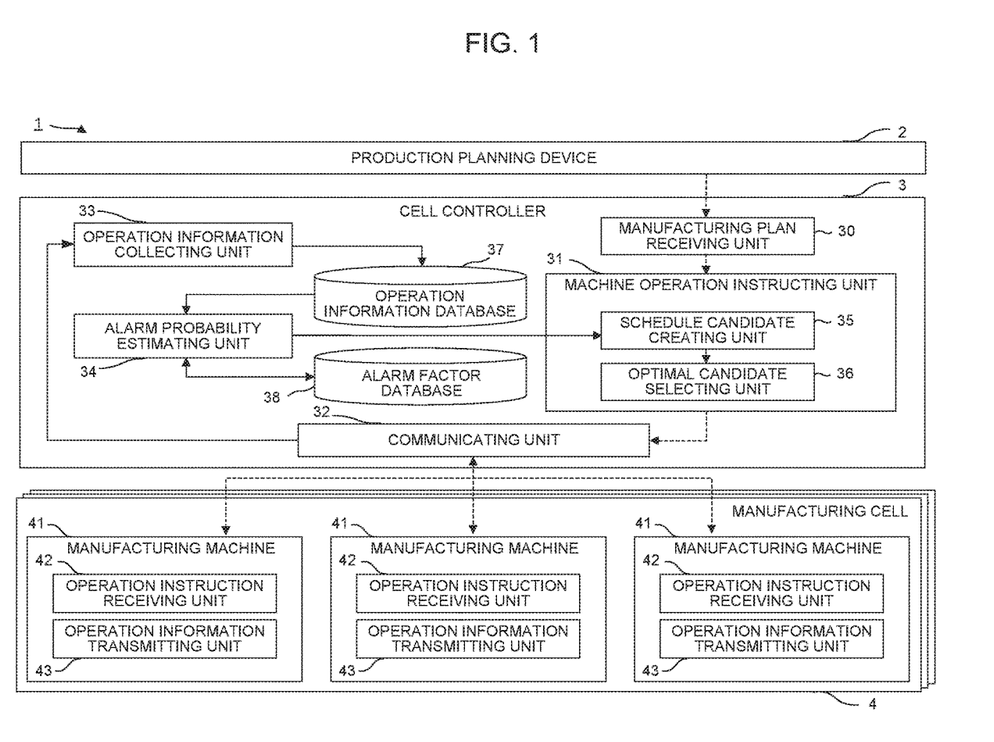
FIG. 1 is a schematic configuration diagram of a cell control system according to one embodiment of the present invention.

FIG. 1 is a schematic configuration diagram of a cell control system according to one embodiment of the present invention. In this regard, in FIG. 1, dotted line arrows indicate information flows according to a conventional technique, and solid line arrows indicate information flows introduced by the present invention. A cell control system 1 according to the present embodiment is configured by connecting a production planning device 2, a cell controller 3 and at least one manufacturing cell 4 via a network.

The production planning device 2 plans an entire manufacturing operation performed by at least one manufacturing cell 4, and transmits the planned manufacturing operation as a manufacturing plan to the cell controller 3 which manages each manufacturing cell 4. The production planning device 2 allocates a manufacturing operation which takes into account production capability of each manufacturing cell 4 similar to the conventional technique, and allocates a manufacturing operation to maximize the entire throughput in order to create a manufacturing plan.

The cell controller 3 manages a use status of a manufacturing machine 41 of the manufacturing cell 4 under management based on the manufacturing plan instructed by the production planning device 2, and decides which manufacturing machine 41 to use to make an operation instruction to each manufacturing cell. The cell controller 3 illustrated in FIG. 1 manages at least one manufacturing cell 4. The cell controller 3 includes a manufacturing plan receiving unit 30, a machine operation instructing unit 31, a communication unit 32, an operation information collecting unit 33 and an alarm probability estimating unit 34.

The manufacturing plan receiving unit 30 receives the manufacturing plan instructed by the production planning device 2, and outputs the received manufacturing plan to the machine operation instructing unit 31.

The machine operation instructing unit 31 transmits the operation instruction to at least one or more manufacturing machines 41 of the manufacturing cell 4 under management of the cell controller 3 via the communication unit 32 based on the manufacturing plan inputted from the manufacturing plan receiving unit 30. The machine operation instructing unit 31 has a function of creating an operation schedule per manufacturing machine 41 of the manufacturing cell 4 under management based on the manufacturing plan similar to the conventional technique.

The machine operation instructing unit 31 includes a schedule candidate creating unit 35 and an optimal candidate selecting unit 36. The schedule candidate creating unit 35 creates a plurality of operation schedule candidates whose order of operation elements of the operation schedule or whose start time has been changed, based on the operation schedule created by the machine operation instructing unit 31. Further, the optimal candidate selecting unit 36 calculates an average necessary time to which an estimated stop time caused by an alarm occurrence is added, for the operation schedule candidate of the manufacturing cell created by the schedule candidate creating unit 35 and the operation schedule of each manufacturing cell created by the conventional technique based on a probability of an occurrence of each alarm estimated by the alarm probability estimating unit 34 described below. When there is an operation schedule candidate whose average necessary time shortens compared to the operation schedule created by the conventional technique, the optimal candidate selecting unit 36 selects this operation schedule candidate as a selected operation schedule. Further, the machine operation instructing unit 31 transmits the operation instruction to each manufacturing machine 41 of each manufacturing cell 4 via the communication unit 32 based on the selected operation schedule selected by the optimal candidate selecting unit 36. More detailed operations of the schedule candidate creating unit 35 and the optimal candidate selecting unit 36 will be described below.

The operation information collecting unit 33 collects operation information indicating an operation state of the manufacturing machine 41 from the manufacturing machine 41 of the manufacturing cell 4 under management, and stores the operation information of each manufacturing machine 41 in an operation information database 37. The operation information collecting unit 33 may collect, as the operation information, every information which the cell controller 3 can obtain such as a time, a power state of a factory and vibration which can be detected near a manufacturing cell in addition to information indicating the operation state of the manufacturing machine 41.

The alarm probability estimating unit 34 performs statistics processing on the operation information of each manufacturing machine 41 collected by the operation information collecting unit 33 and stored in the operation information database 37 to estimate the alarm occurrence probability based on the alarm factor of each manufacturing machine 41, and estimate a recovery time during the alarm occurrence. The cell controller 3 includes an alarm factor database 38 which is prepared in advance and records a correspondence between an alarm which the manufacturing machine 41 can detect and the alarm factor, and the alarm occurrence probability based on the alarm factor. The cell controller 3 registers an alarm factor of an alarm which occurs in each manufacturing cell 4 and is known to some degree in the alarm factor database 38. The alarm probability estimating unit 34 performs statistics processing by using the operation information of each manufacturing machine 41 accumulated in the operation information database 37, and the correspondence between the alarms and the alarm factors stored in the alarm factor database 38 to calculate the alarm occurrence probability based on each alarm factor and store the calculated alarm occurrence probability in the alarm factor database 38.

Figure 2:
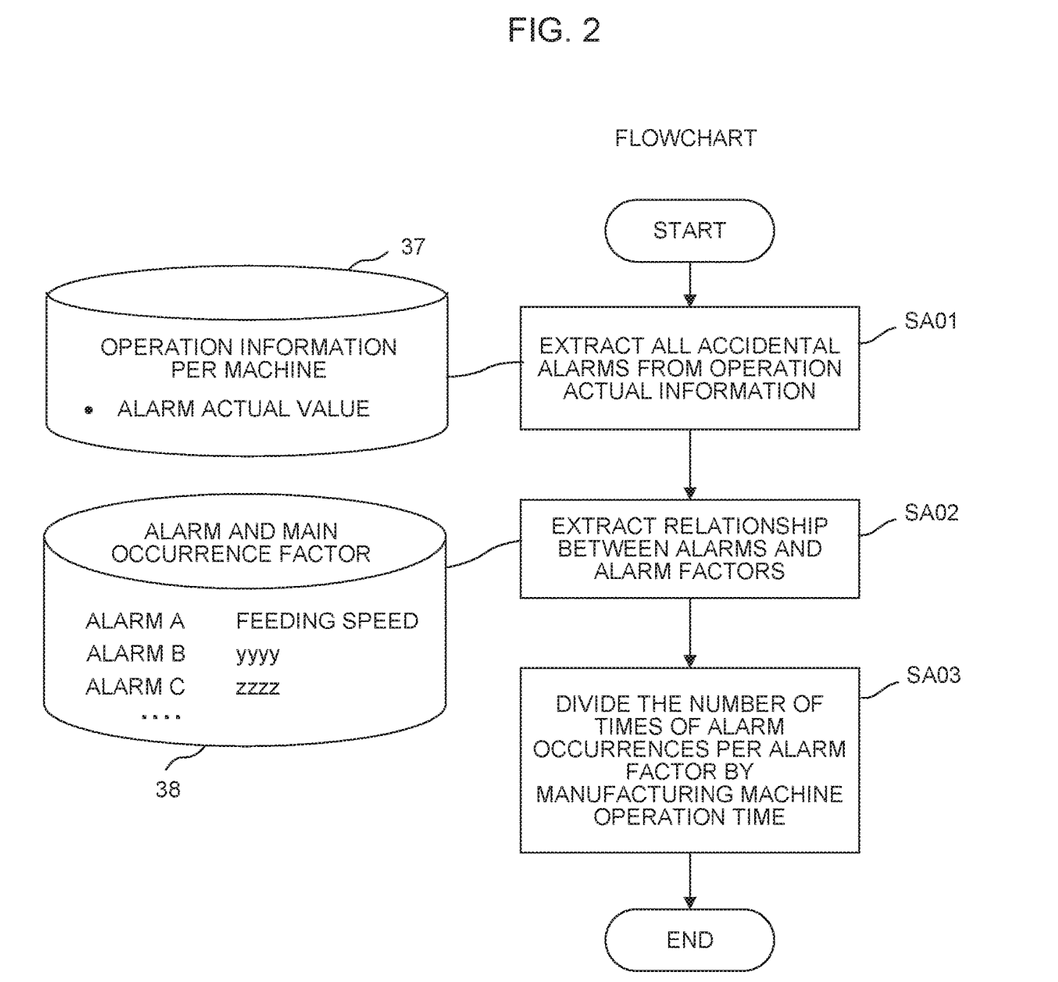
FIG. 2 is a flowchart of processing of an alarm probability estimating unit of the cell controller of calculating an alarm occurrence probability based on an alarm factor.

FIG. 2 is a flowchart of processing of the alarm probability estimating unit 34 of calculating the alarm occurrence probability based on the alarm factor. The alarm probability estimating unit 34 first extracts from the operation information database 37 only alarms which accidentally occur during the operation from alarms which have occurred so far during the operation in one manufacturing machine 41 (step SA01). The alarm probability estimating unit 34 can decide the alarms which accidentally occur by excluding alarms of artificial factors based on contents inputted by an operator in charge of the manufacturing machine 41 via a control panel of the manufacturing machine 41 when an alarm occurs. Further, the alarm probability estimating unit 34 refers to alarm factors registered in the alarm factor database 38 for the extracted alarms which accidentally occur during the operation (step SA02). When an alarm occurs and a corresponding alarm factor also occurs simultaneously, the alarm probability estimating unit 34 decides that the alarm relates to the alarm factor. Furthermore, the alarm probability estimating unit 34 can calculate the alarm occurrence probability (a reciprocal of MTBF) per unit time by dividing the number of times of alarm occurrences related to the alarm factor within an operation time by the operation time of the manufacturing machine based on one production instruction (SA03).

Alarm factors may be, for example, instruction contents of the processing program, operation statuses of other manufacturing machines or an operation status (such as deterioration) of the manufacturing machine 41, and may select other pieces of information which the cell control system 1 can obtain as alarm factors.

Further, the alarm probability estimating unit 34 may perform statistics processing (significance test and correlation analysis) on the operation information stored in the operation information database 37 to specify a new alarm factor and update the alarm factor database 38.

Furthermore, the alarm probability estimating unit 34 may estimate information of the alarm occurrence probability by using an actual value of an operating manufacturing machine of the factory. In this case, the alarm probability estimating unit 34 may estimate the information by making a correlation model by machine learning such as a convolution neural net.

The alarm probability estimating unit 34 further estimates a necessary recovery time during an alarm occurrence, and stores the estimated necessary recovery time in the alarm factor database 38 in association with each alarm. The alarm probability estimating unit 34 may statistically analyze the operation time stored in the operation information database 37 and calculate an estimated necessary recovery time per alarm to estimate the necessary recovery time during alarm occurrence. This estimated necessary recovery time is multiplied with the alarm occurrence probability by the optimal candidate selecting unit 36 and is used to calculate the necessary recovery time per production instruction. The estimated necessary recovery time is an estimated value of the necessary time taken for recovery according to the degree of failure such as a servo alarm, overheat or an error due to noise deriving from a tool damage. In this regard, a value estimated by the alarm probability estimating unit 34 may be used as the estimated necessary recovery time. However, an empirical value estimated based on a past experience of a skilled operator may be set in a fixed manner.

Back to FIG. 1, the manufacturing cell 4 includes at least one manufacturing machine 41. Further, each manufacturing machine 41 includes an operation instruction receiving unit 42 and an operation information transmitting unit 43.

The operation instruction receiving unit 42 receives an operation instruction transmitted from the cell controller 3, and outputs the received operation instruction to a control unit of the manufacturing machine which is not illustrated. The control unit which receives the operation instruction from the operation instruction receiving unit 42 controls each unit of the manufacturing machine 41 based on the inputted operation instruction, and collects information collected from each unit of the manufacturing machine 41. Further, the operation information transmitting unit 43 transmits the information collected from each unit of the manufacturing machine 41 by the control unit, as the operation information to the cell controller 3.

Figure 3:
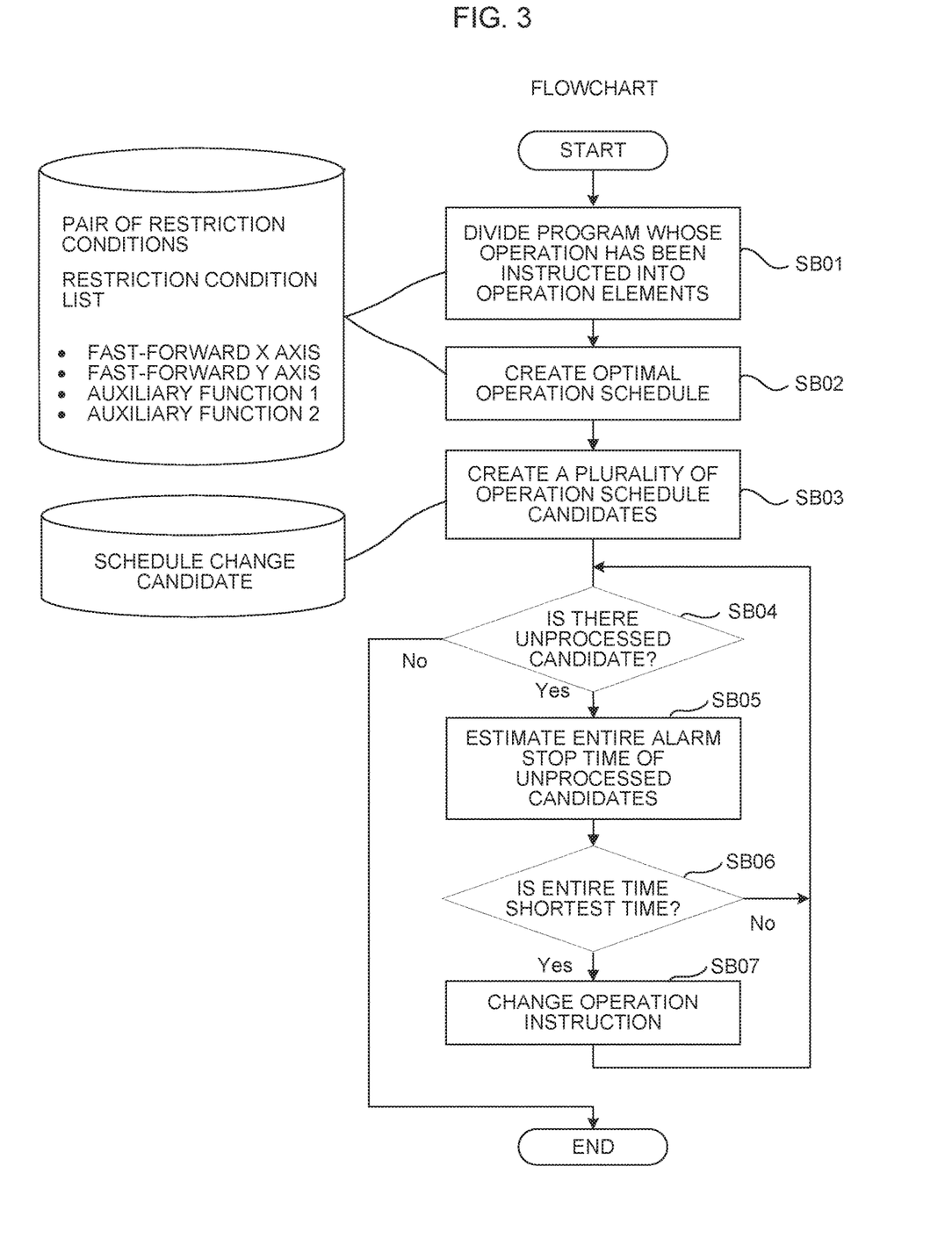
FIG. 3 is a flowchart illustrating operations of a schedule candidate creating unit and an optimal candidate selecting unit of the cell controller.

Operations of the schedule candidate creating unit 35 and the optimal candidate selecting unit 36 of the cell control system 1 according to the present embodiment employing the above configuration will be described with reference to FIGS. 3 and 4.

When receiving an input of a manufacturing plan from the manufacturing plan receiving unit 30, the machine operation instructing unit 31 creates an operation schedule based on the manufacturing plan. The machine operation instructing unit 31 divides contents (program contents) of each processing of the operation instruction which needs to be given to each manufacturing machine 41 based on the manufacturing plan, into operation elements (acceleration/deceleration/movement per axis and an auxiliary function) in chronological order (step SB01). The machine operation instructing unit 31 creates an optimal operation schedule in which the divided operation elements are rearranged to maximize the entire throughput while satisfying restriction conditions of the processing (step SB02). In this regard, details of processing of the machine operation instructing unit 31 of creating the optimal operation schedule are the same as processing of the conventional technique, and therefore will not be described in this description.

The machine operation instructing unit 31 creates the optimal operation schedule, and then instructs the schedule candidate creating unit 35 to create an operation schedule candidate which is a counter proposal of the operation schedule. The schedule candidate creating unit 35 creates a plurality of schedule candidates whose order of the operation elements or whose start time has been changed based on the operation schedule created by the machine operation instructing unit 31 (step SB03). In this regard, these operation schedule candidates may exceed a necessary time of the original operation schedule.

When the schedule candidate creating unit 35 creates a plurality of operation schedule candidates, the optimal candidate selecting unit 36 refers to an alarm occurrence rate of each alarm per unit time for the operation schedule and each operation schedule candidate. The optimal candidate selecting unit 36 calculates an estimated value of an alarm stop time based on the alarm occurrence rate per alarm, and estimates the alarm stop time of the entire schedule by integrating these estimated values (step SB05). Further, the schedule candidate creating unit 35 adds the estimated alarm stop time to a predicted necessary time of the entire schedule, and selects a schedule of the shortest stop time as the selected operation schedule (steps SB06 and SB07). Processing is finished when there is no unprocessed candidate of the operation schedule candidates (step SB04). Furthermore, the machine operation instructing unit 31 transmits the operation instruction to each manufacturing machine based on the selected operation schedule. In this regard, the alarm occurrence rate is calculated by using processing contents of the manufacturing machine 41 and information of simultaneously operating manufacturing machine 41.

Figure 4:
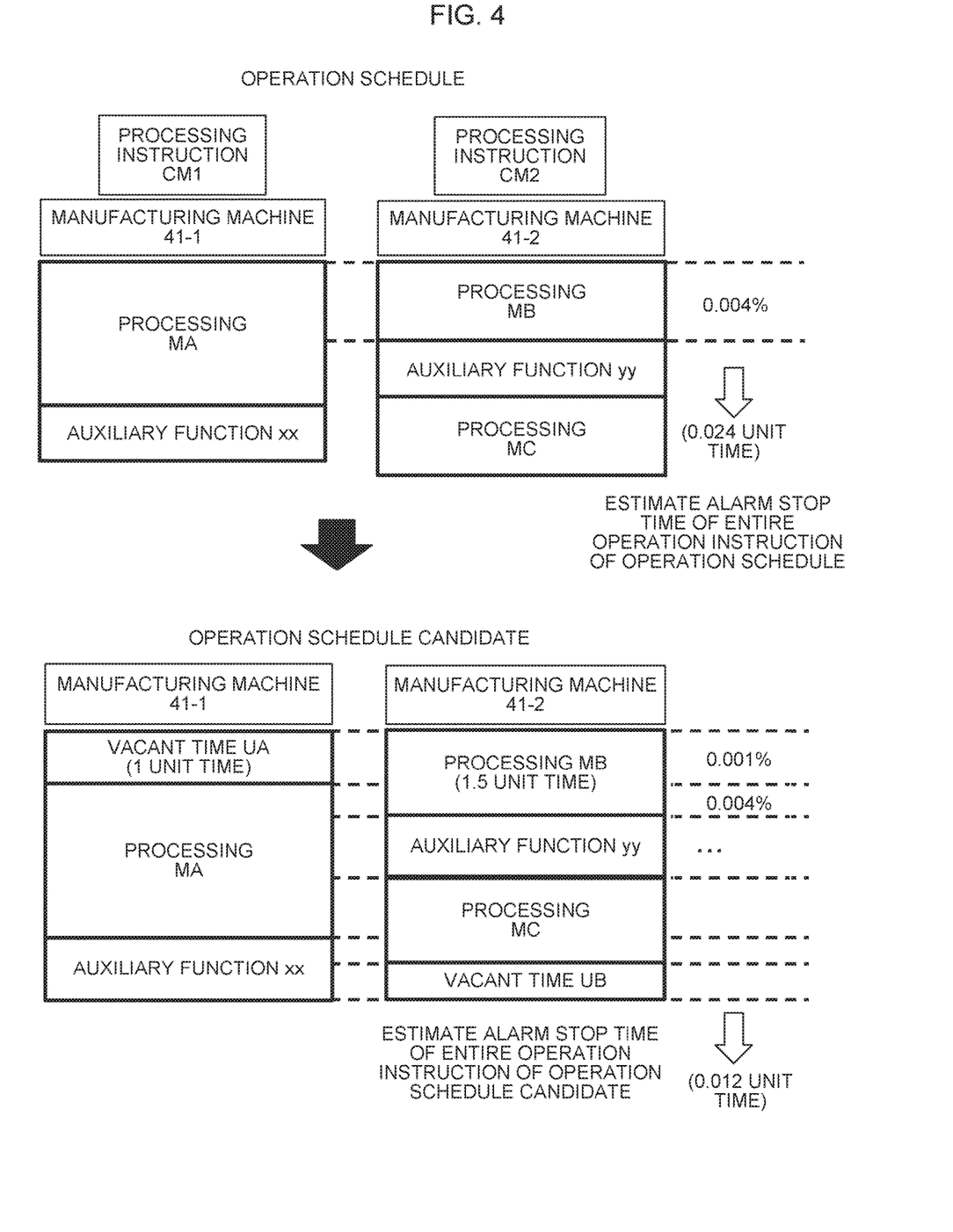
FIG. 4 is a view illustrating an example where the optimal candidate selecting unit of the cell controller estimates an entire alarm stop time of an operation schedule and operation schedule candidates.

FIG. 4 is a view illustrating an example where the optimal candidate selecting unit of the cell controller estimates an entire alarm stop time of an operation schedule and operation schedule candidates. An upper part of FIG. 4 illustrates the operation schedule, and a lower part of FIG. 4 illustrates the operation schedule candidate.

The operation schedule provides a processing instruction CM1 including processing MA and an auxiliary function xx to the manufacturing machine 41, and provides a processing instruction CM2 including processing MB, an auxiliary function yy and processing MC to the manufacturing machine 42.

As illustrated in, for example, FIG. 4, an occurrence rate of an alarm C per unit time in the manufacturing machine 42 in case where the single manufacturing machine 41 performs the processing MB (1.5 unit time) is 0.001%, and the occurrence rate of the alarm C per unit time in the machine 42 in case where the manufacturing machine 42 simultaneously performs the processing MB while the manufacturing machine 41 performs the processing MA is 0.004%. In this case, if the estimated necessary recovery time in case where the alarm C occurs is four unit times, while a stop time of the alarm C of the entire operation schedule illustrated in the upper part of FIG. 4 is 0.004×1.5×4=0.024 unit times, a stop time of an alarm of the entire operation schedule candidates illustrated in the lower part of FIG. 4 (an operation of the processing MA of the manufacturing machine 41 is delayed (vacant time UA) by one unit time to shorten an overlap time of the processing MA and the processing MB) is (0.001× 1+0.004×0.5)×4=0.012 unit times. Hence, in an example in FIG. 4, when a vacant time UB of the operation schedule is shorter than the 0.012 unit times, the operation schedule candidate is selected as the selected operation schedule instead of the operation schedule.

The embodiment according to the present invention has been described above. However, the present invention is not limited to an example of the above embodiment and can be optionally changed and carried out in various modes.

The invention claimed is:

1. A cell control system, comprising:
   a production planning device;
   at least one manufacturing cell that includes a plurality of manufacturing machines; and
   a cell controller that transmits an operation instruction to the plurality of manufacturing machines based on a manufacturing plan received from the production planning device, wherein
   the cell controller includes
      a machine operation instructing unit that creates an operation schedule of the plurality of manufacturing machines based on the manufacturing plan,
      an operation information collecting unit that collects operation information of the plurality of manufacturing machines, the operation information including an operation time of one of the manufacturing machines,
      an alarm probability estimating unit that estimates an alarm occurrence probability per unit time by dividing the number of times of alarm occurrences by the operation time collected by the operation information collecting unit, the alarm occurrence probability being
         a probability that an alarm occurs in a case where a single one of the plurality of manufacturing machines performs processing, and
         a probability that an alarm occurs in a case where the plurality of manufacturing machines simultaneously perform processing,
      a schedule candidate creating unit that creates at least one operation schedule candidate based on the operation schedule created by the machine operation instructing unit, the operation schedule candidate having a changed order of an operation element configuring the operation schedule or a changed start time of the operation time, and
      an optimal candidate selecting unit that
         estimates a necessary time that takes the occurrence of the alarm into account for each of the operation schedule and the operation schedule candidate based on both (i) the alarm occurrence probability estimated by the alarm probability estimating unit when a single manufacturing machine of the plurality of the manufacturing machines performs the processing and (ii) the alarm occurrence probability estimated by the alarm probability estimating unit when the plurality of the manufacturing machines simultaneously performs the processing, and
         selects, as a selected operation schedule, one of the operation schedule and the operation schedule candidate with a shortest necessary time that takes the occurrence of the alarm into account, and
      the machine operation instructing unit transmits the operation instruction to the plurality of manufacturing machines based on the selected operation schedule.

2. The cell control system according to claim 1, wherein the alarm probability estimating unit estimates a necessary recovery time based on the operation information of the plurality of manufacturing machines, the necessary recovery time being a necessary time that is necessary to recover from the alarm when the alarm occurs, and the optimal candidate selecting unit estimates the necessary time that takes the occurrence of the alarm into account for each of the operation schedule and the operation schedule candidate based on the alarm occurrence probability and the necessary recovery time estimated by the alarm probability estimating unit.

\* \* \* \* \*